(12) United States Patent
Oh et al.

(10) Patent No.: US 10,236,335 B2
(45) Date of Patent: Mar. 19, 2019

(54) DISPLAY DEVICE

(71) Applicant: LG Display Co., Ltd., Seoul (KR)

(72) Inventors: Hyemi Oh, Gwangju (KR); Bumsik Kim, Suwon-si (KR); Younsub Kim, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/806,049

(22) Filed: Nov. 7, 2017

(65) Prior Publication Data

US 2018/0151661 A1    May 31, 2018

(30) Foreign Application Priority Data

Nov. 30, 2016   (KR) .................. 10-2016-0161517

(51) Int. Cl.
*H01L 27/32* (2006.01)

(52) U.S. Cl.
CPC ...... *H01L 27/3276* (2013.01); *H01L 27/3272* (2013.01); *H01L 2251/568* (2013.01)

(58) Field of Classification Search
CPC ............. H01L 27/3276; H01L 27/3272; H01L 2251/568; H01L 33/62
See application file for complete search history.

(56) References Cited

U.S. PATENT DOCUMENTS

| | | | |
|---|---|---|---|
| 6,100,948 A | 8/2000 | Kim et al. | |
| 6,307,216 B1 | 10/2001 | Huh et al. | |
| 6,429,909 B1 | 8/2002 | Kim et al. | |
| 6,717,634 B2 | 4/2004 | Kim et al. | |
| 6,888,589 B2 | 5/2005 | Kim et al. | |
| 7,463,323 B2 | 12/2008 | Kim et al. | |
| 7,741,646 B2 | 6/2010 | Kang et al. | |
| 7,943,405 B2 | 5/2011 | Kang et al. | |
| 9,425,243 B2 | 8/2016 | Jung et al. | |
| 9,634,294 B2 | 4/2017 | Jung et al. | |
| 2002/0158996 A1 | 10/2002 | Kim et al. | |
| 2002/0180926 A1 | 12/2002 | Mizumura et al. | |

(Continued)

FOREIGN PATENT DOCUMENTS

| | | |
|---|---|---|
| EP | 2159632 A1 | 3/2010 |
| JP | H01-284831 A | 11/1989 |

(Continued)

OTHER PUBLICATIONS

Combined Search and Examination Report, Intellectual Property Office Patent Application No. GB1719365.7, dated Apr. 30, 2018, 7 pages.

*Primary Examiner* — Sonya D. McCall-Shepard
(74) *Attorney, Agent, or Firm* — Fenwick & West LLP

(57) ABSTRACT

The present disclosure is provided a display device. The display device includes subpixels and at least one scan line. The subpixels are formed on a first substrate, and each of the subpixels includes an emission area, in which a light emitting element for emitting light is disposed, and a circuit area in which a circuit for driving the light emitting element is disposed. The at least one scan line may be disposed on the circuit area in a horizontal direction. The at least one scan line may include: an upper scan line and a lower scan line spaced apart from each other; and a scan connection line positioned between the upper scan line and the lower scan line and electrically connecting the upper scan line and the lower scan line.

12 Claims, 13 Drawing Sheets

(56) References Cited

U.S. PATENT DOCUMENTS

| | | |
|---|---|---|
| 2004/0001176 A1 | 1/2004 | Kim et al. |
| 2004/0141099 A1 | 7/2004 | Kim et al. |
| 2007/0131936 A1 | 6/2007 | Kang et al. |
| 2010/0231495 A1 | 9/2010 | Kang et al. |
| 2013/0307833 A1 | 11/2013 | Lee et al. |
| 2014/0247200 A1* | 9/2014 | Jinta .................. H01L 25/048 345/76 |
| 2016/0035808 A1 | 2/2016 | Jung et al. |
| 2016/0343995 A1 | 11/2016 | Jung et al. |

FOREIGN PATENT DOCUMENTS

| | | |
|---|---|---|
| JP | H09-311642 A | 12/1997 |
| JP | H11-084421 A | 3/1999 |
| JP | 2000-310796 A | 11/2000 |
| JP | 2001-305578 A | 10/2001 |
| JP | 2010-097230 A | 4/2010 |
| JP | 2011-237827 A | 11/2011 |
| JP | 2015-228361 A | 12/2015 |
| JP | 2016-033661 A | 3/2016 |

* cited by examiner

DISPLAY DEVICE

CROSS-REFERENCE TO RELATED APPLICATIONS

This application claims the benefit of Republic of Korea Patent Application No. 10-2016-0161517, filed on Nov. 30, 2016, which is hereby incorporated by reference in its entirety.

BACKGROUND

Field of Technology

The present disclosure relates to a display device.

Discussion of the Related Art

With the development of information technologies, there are increasing demands for a display device which is a medium enabling a user to access information. Accordingly, display devices, such as an Organic Light Emitting Display (OLED), a Liquid Crystal Display (LCD), and a Plasma Display Panel (PDP), have become used more widely.

Among the display devices, the OLED includes a display panel including a plurality of subpixels and a driving unit for driving the display panel. The driving unit includes a scan driver for supplying a scan signal (or a gate signal) to the display panel, and a data driver for supplying a data signal to the display panel.

The OLED operates such that, when the scan signal or the data signal is supplied to subpixels arranged in matrix, a selected subpixel emits light so that an image is displayed.

The OLED has a problem that characteristics (a threshold voltage, a current mobility, etc.) of an element included in a subpixel changes if the display device is used for a long period of time. To compensate the change in the characteristics, there have been proposed an existing method of adding a sensing circuit for sensing characteristics of an element included in a subpixel.

However, if a sensing circuit is added to each subpixel, it is necessary to consider various tasks, for example, an aperture ratio of a subpixel and margin for a repair process. In addition, the need for considering these tasks increases if a display panel has higher resolution and a larger screen.

SUMMARY

In one general aspect of the present disclosure, there is provided a display device including subpixels and at least one scan line. The subpixels are formed on a first substrate, and each of the subpixels includes an emission area, in which a light emitting element for emitting light is disposed, and a circuit area in which a circuit for driving the light emitting element is disposed. The at least one scan line may be disposed on the circuit area in a horizontal direction. The at least one scan line may include: an upper scan line and a lower scan line spaced apart from each other; and a scan connection line positioned between the upper scan line and the lower scan line and electrically connecting the upper scan line and the lower scan line.

In another general aspect of the present disclosure, there is provided a display device including: a plurality of subpixels; and a scan line connected to the plurality of subpixels, wherein the scan line is in a shape of a ladder positioned in a horizontal direction.

BRIEF DESCRIPTION OF THE DRAWINGS

The accompany drawings, which are included to provide a further understanding of the present disclosure and are incorporated on and constitute a part of this specification illustrate embodiments of the present disclosure and together with the description serve to explain the principles of the present disclosure.

DETAILED DESCRIPTION

Reference will now be made in detail to embodiments of the present disclosure, examples of which are illustrated in the accompanying drawings.

Hereinafter, specific embodiments of the present disclosure will be described with the accompanying drawings.

A display device according to the present disclosure may be implemented as a TV, a video player, a personal computer (PC), a home theater, a smart phone, and the like. In the following, an organic light emitting display (OLED) based on an organic light emitting diode (a light emitting element) is described. The OLED performs an image display operation, and an external compensation operation for compensation of a device based on change over time (aging characteristics).

The external compensation operation may be performed in a vertical blank interval during image display, in a power-on sequence interval before the beginning of image display, or in a power-off sequence interval after the end of image display. The vertical blanking interval is the time during which image data is not written, which is arranged between vertical active periods in which one frame of image data is written.

The power-on sequence interval is the time between the turn-on of driving power and the beginning of image display.

The power-off sequence interval is the time between the end of image display and the turn-off of driving power.

The external compensation method for performing external compensation enables operating a driving transistor in a source follower way, and then sensing of a voltage (a source voltage of a driving TFT) stored in a line capacitor of a sensing line. However, aspects of the present disclosure are not limited thereto. The line capacitor indicates a unique capacity existing in the sensing line.

To compensate for a threshold voltage deviation of driving transistors, the external compensation method senses a source voltage when a potential of a source node of the driving transistor is in a saturation state (that is, when a current Ids of the driving TFT becomes 0). In addition, to compensate for a mobility deviation of driving transistors, the external compensation method senses a value in a linear state which is before the source node of the driving transistor reaches the saturation state.

In addition, terms used herein, such as a signal, a line, and a device, may differ from a manufacturer to a manufacturer, and thus, functional interpretation of each term is required. In the following, a Thin Film Transistor (TFT) may be called a source electrode and a drain electrode or a drain electrode and a source electrode, except for a gate electrode. However, to avoid any limitation, the source electrode and the drain electrode are described as a first electrode and a second electrode.

Figure 1:
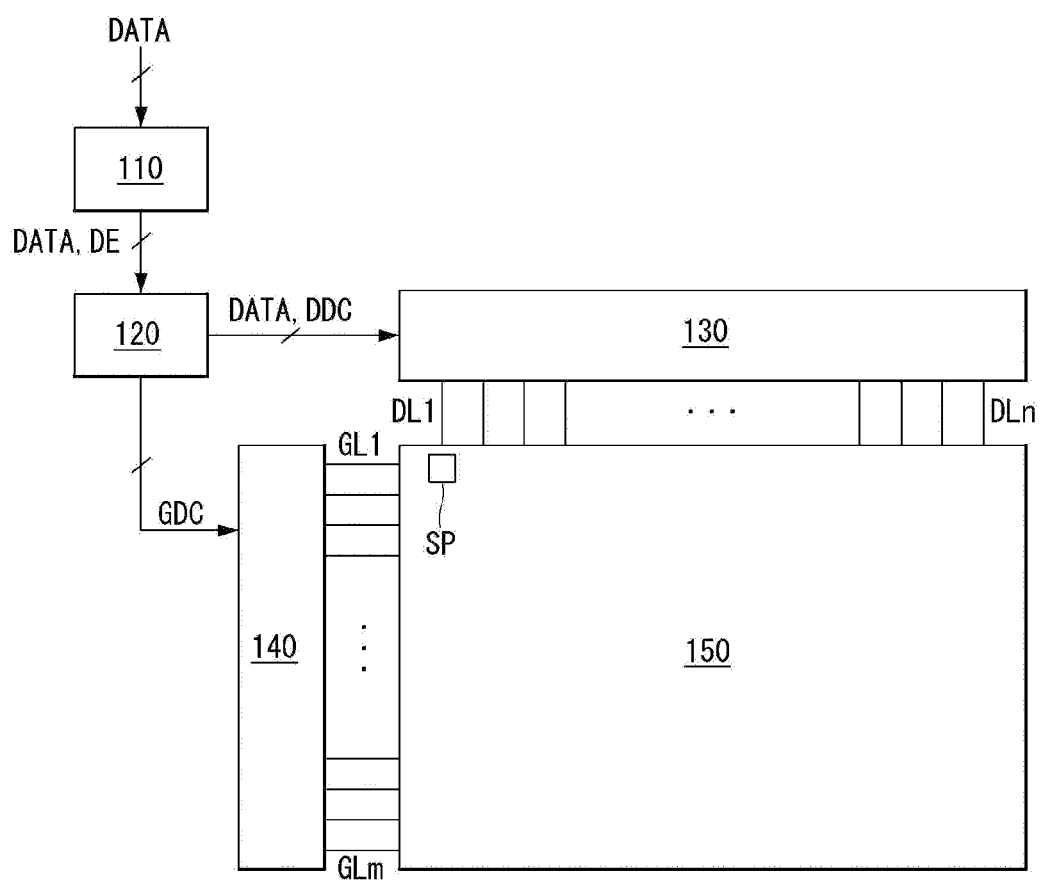
FIG. 1 is a schematic block diagram illustrating an organic light emitting display (OLED) according to an embodiment.
Figure 2:
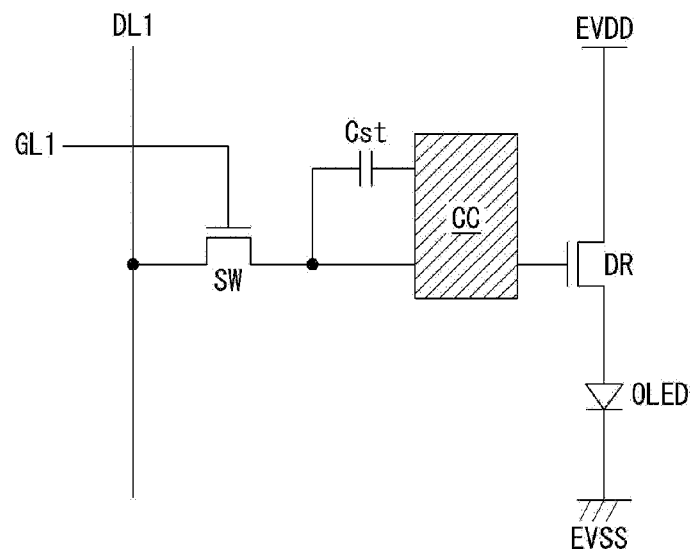
FIG. 2 is a schematic circuit diagram illustrating a subpixel according to an embodiment.
Figure 3:
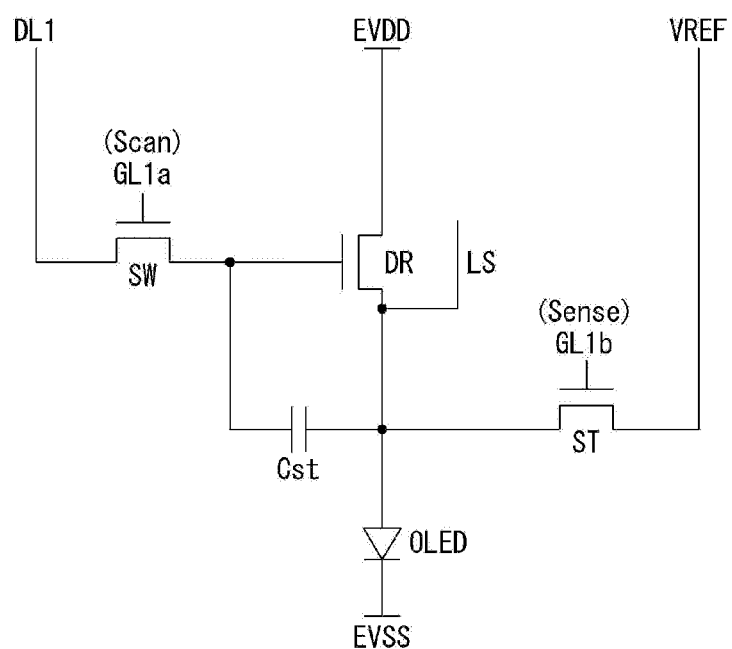
FIG. 3 is an exemplary detailed circuit diagram of a subpixel according to an embodiment.
Figure 4:
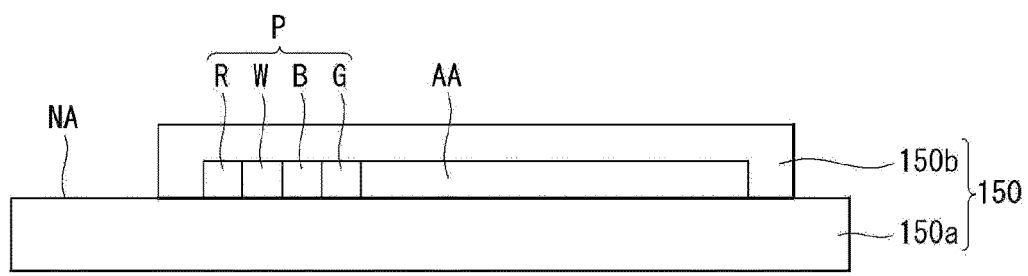
FIG. 4 is an exemplary cross-sectional view of a display panel according to an embodiment.

FIG. 1 is a schematic block diagram illustrating an organic light emitting display (OLED), FIG. 2 is a schematic circuit diagram illustrating a subpixel, FIG. 3 is an exemplary detailed circuit diagram of a subpixel, and FIG. 4 is an exemplary cross-sectional view of a display panel.

As illustrated in FIG. 1, the OLED includes an image processing unit 110, a timing controller 120, a data driver 130, a scan driver 140, and a display panel 150.

The image processing unit 110 outputs a data enable signal DE in addition to a data signal DATA supplied from the outside. The image processing unit 110 may output at least one of a vertical synchronization signal, a horizontal synchronization signal, and a clock signal, in addition to the data enable signal DE, but these signals are not depicted in drawings for convenience of explanation.

The timing controller 120 is supplied from the image processing unit 110 with a data signal DATA in addition to a data enable signal DE and a driving signal which includes a vertical synchronization signal, a horizontal synchronization signal, and a clock signal. Based on a driving signal, the timing controller 120 outputs a gate timing control signal GDC for controlling an operation timing of the gate driver 140, and a data timing control signal DDC for controlling an operation timing of the data driver 130.

In response to a data timing control signal DDC supplied from the timing controller 120, the data driver 130 may samples and latches a data signal DATA from the timing controller 120, converts the data signal DATA into a gamma reference voltage, and outputs the gamma reference voltage. The data driver 130 outputs the data signal DATA through data lines DL1 to DLn. The data driver 130 is formed as an Integrated Circuit (IC).

In response to a timing control signal GDC supplied from the timing controller 120, the scan driver 140 outputs a gate signal. The scan driver 140 outputs a gate signal through scan lines GL1 to GLm. The scan driver 140 is formed as an IC, or formed on the display panel 150 by a Gate In Panel method.

In response to a data signal DATA from the data driver 130 and a scan signal from the scan driver 140, the display panel 150 displays an image. The display panel 150 includes subpixels SP that operate so that an image is displayed.

The subpixels SP may include red subpixels, green subpixels, and blue subpixels, or may include white subpixels, red subpixels, green subpixels, and blue subpixels. The subpixels SP may have one or more emission areas depending on their emission characteristics.

As shown in FIG. 2, each subpixel SP includes a switching transistor SW, a driving transistor DR, a capacitor Cst, a compensation circuit CC, and an organic light emitting diode (OLED).

In response to a scan signal received through a first scan line GL1, the switching transistor SW performs a switching operation so that a data signal received through a first data line DL1 is stored in the capacitor Cst as a data voltage. The driving transistor DR operates so that the driving current flows between a first power line EVDD (a high-potential power) and a second power line EVSS (a low-potential power) depending on the data voltage stored in the capacitor Cst. The organic light emitting diode OLED operates to emit light depending on a driving current formed by the driving transistor DR.

The compensation circuit CC is a circuit that is added inside a subpixel to compensate for a threshold voltage of the driving transistor DR. The compensation circuit CC includes at least one transistor. The compensation circuit CC may have various configurations depending on an external compensation method, and one example thereof will be described in the following.

As illustrated in FIG. 3, the compensation circuit includes a sensing transistor ST and a sensing line VREF (or a reference line). The sensing transistor ST is connected between a source electrode of the driving transistor DR and an anode electrode of the organic light emitting diode OLED (hereinafter, referred to as a sensing node). The sensing transistor ST operates so that an initialization voltage received through the sensing line VREF is supplied to the sensing node of the driving transistor DR or that a voltage or current of the sensing node of the driving transistor DR or a voltage or current of the sensing line VREF is sensed.

The switching transistor SW includes a first electrode connected to a first data line DL1, and a second electrode connected to a gate electrode of the driving transistor DR. The driving transistor DR includes a first electrode connected to a first power line EVDD, and a second electrode connected to the anode electrode of the organic light emitting diode OLED. The capacitor includes a first electrode connected to a gate electrode of the driving transistor DR, and a second electrode connected to the anode electrode of the organic light emitting diode OLED. The organic light emitting diode OLED includes the anode electrode connected to the second electrode of the driving transistor DR, and a cathode electrode connected to a second power line EVSS. The sensing transistor ST includes a first electrode connected to the sensing line VREF, and a second electrode connected to the anode electrode of the organic light emitting diode OLED and to the second electrode of the driving transistor DR which is a sensing node.

An operation time of the sensing transistor ST may be similar/identical to an operation time of the switching transistor SW depending on an external compensation algorithm (or configuration of the compensation circuit). For example, a 1-a scan line GL1a connected to the gate electrode of the switching transistor SW and a 1-b scan line GL1b connected to the gate electrode of the sensing transistor ST may be connected for common sharing. In another example, the switching transistor SW may include the gate electrode connected to the 1-a scan line GLa, and the sensing transistor ST may include the gate electrode connected to the 1-b scan line GL1b. In this case, the 1-a scan line GL1a and the 1-b scan line GL1b may be separate so as to transmit different scan signals.

The sensing line VREF may be connected to the data driver. In this case, the data driver may sense a sensing node of each subpixel and generate a sensing result in real time, in a non-display time of an image, or in a time period of N-th frame (N is an integer equal to or greater than 1). Meanwhile, the switching transistor SW and the sensing transistor ST may be turned on at the same time. In this case, a sensing operation and a data outputting operation, both of which are performed through the sensing line VREF, are separate In addition, a compensation target according to a sensing result may be a digital data signal, an analog data signal, or a gamma. In addition, the compensation circuit which generates a compensation signal (or a compensation voltage) based on the sensing result may be provided inside the data driver or an element of the timing controller, or may be implemented as an additional circuit.

A light shield layer LS may be disposed only below a channel region of the driving transistor DR, or may be disposed not just below the channel region of the driving transistor DR but also below channel regions of the switching transistor SW and the sensing transistor ST. The light shield layer LS may be used only to shield external light, and may be used as an electrode in order to seek for connection with a different electrode or line and configure a capacitor or the like. Thus, the light shield layer LS is selected as multiple metal layers (multiple layers of heterogeneous metal materials).

In FIG. 3, an example of a subpixel in a 3T(Transistor) 1C(Capacitor) structure which includes a switching transistor SW, a driving transistor DR, a capacitor Cst, an organic light emitting diode OLED, and a sensing transistor ST is described. However, if a compensation circuit CC is added, a subpixel may be configured in a 3T2C, 4T2C, 5T1C, or 6T2C structure.

As illustrated in FIG. 4, subpixels are formed on a display area AA of a first substrate (or a TFT substrate) 150a based on a circuit which is described with reference to FIG. 3. The subpixels formed on the display area AA is sealed by a protective film (or a protective substrate) 150b. "NA" indicates a non-display area. The first substrate 150a may be formed of glass or a flexible material.

The subpixels may be horizontally or vertically arranged in order of red (R), white (W), blue (B), and green (G) subpixels. A red (R) subpixel, a white (W) subpixel, a blue (B) subpixel, and a green (G) subpixel constitute one pixel P. However, the order of arrangement of subpixels may vary depending on configuration (or structure) of a compensation circuit. In addition, a red (R) subpixel, a blue (B) subpixel, and a green (G) subpixel may constitute one pixel P.

Meanwhile, a process of manufacturing the display panel 150 includes: a deposition process in which a conductive layer, a metal layer, and an insulation layer are deposited on a substrate to form structures such as elements (including electrodes), power lines, and signal lines; and a repair process in which a defect in a structure formed on the substrate is repaired or in which a subpixel having a defect is darkened.

The display panel manufacturing process requires such complicated steps. Thus, to add a sensing circuit to sense characteristics of an element included in a subpixel, it is necessary to consider various tasks including not just an aperture ratio of a subpixel but also the margin for the repair process. The need for considering these tasks increases when a display device has high resolution and a large screen.

Hereinafter, a problem of an experimental example and embodiments of the present disclosure for solving the problem will be described. The following description is about an example where one scan line is disposed in one scanning line. However, the present disclosure is not limited thereto.

Experimental Example

Figure 5:
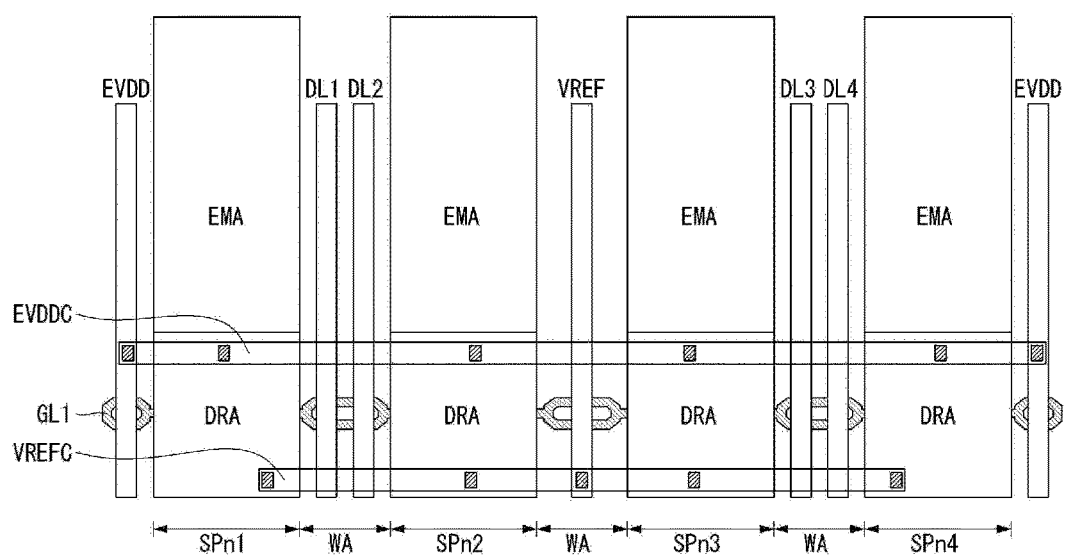
FIG. 5 is a diagram schematically illustrating a plane layout of a subpixel according to an experimental example.
Figure 6:
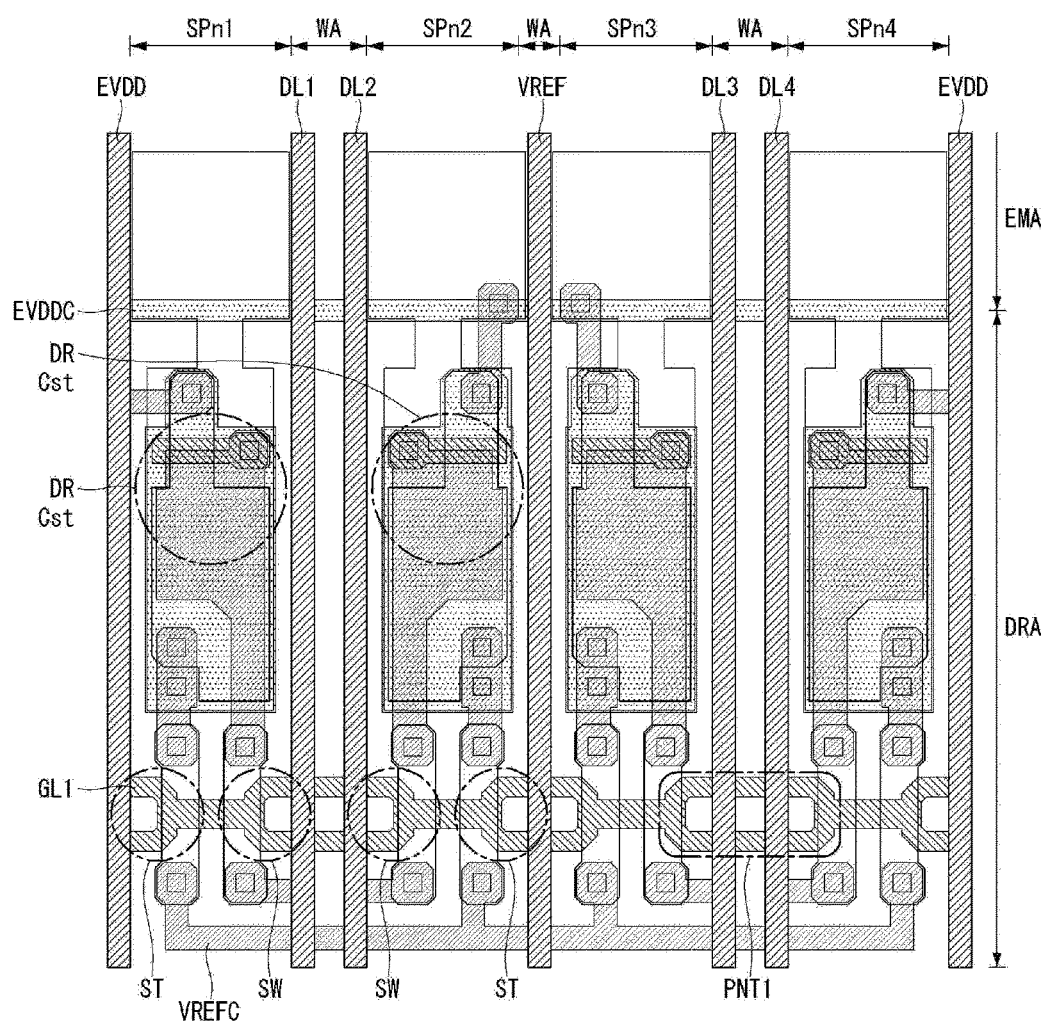
FIG. 6 is a detailed diagram illustrating a plane layout of a subpixel according to the experimental example.
Figure 7:
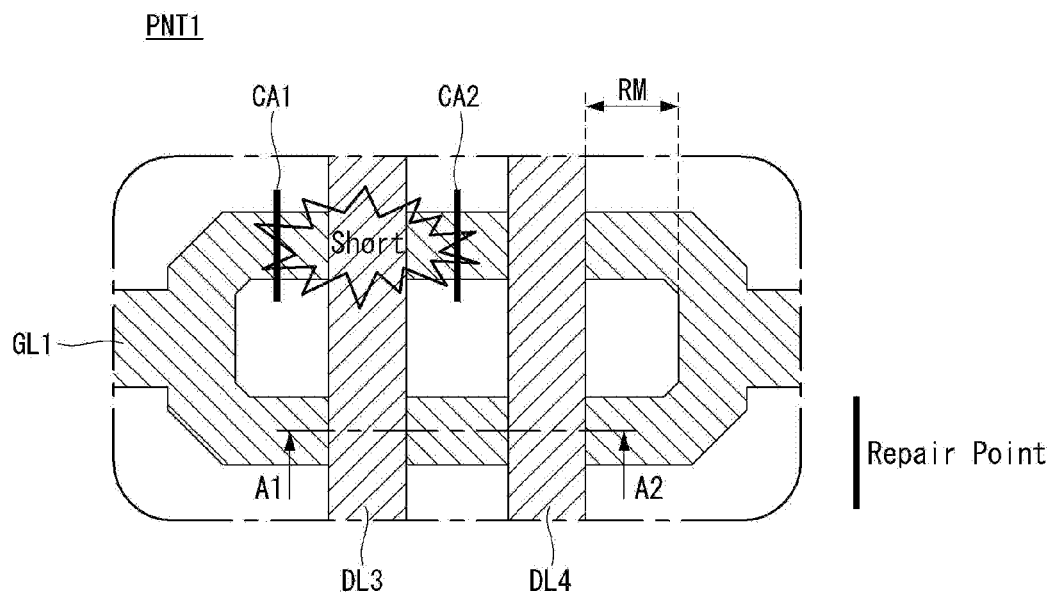
FIGS. 7 and 8 are diagrams for explanation of a problem of the experimental example.
Figure 8:
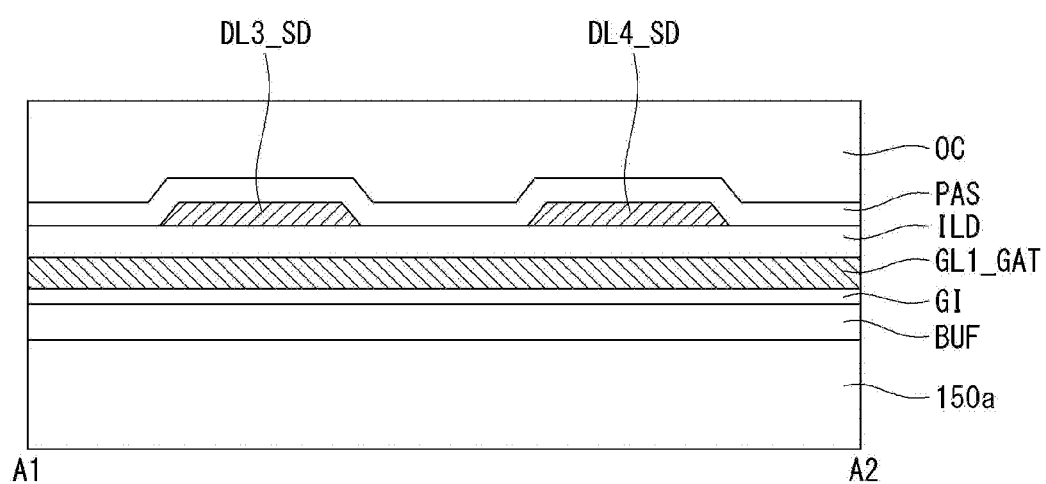

FIG. 5 is a schematic diagram illustrating a plane layout of a subpixel according to an experimental example, FIG. 6 is a detailed diagram illustrating a plane layout of a subpixel according to the experimental example, and FIGS. 7 and 8 are diagrams for explanation of a problem of the experimental example.

As illustrated in FIGS. 4 and 5, first to fourth subpixels SPn1 to SPn4 each having an emission area EMA and a circuit area DRA are formed on a display area AA of a first substrate 150a. An organic light emitting diode OLED (an light emitting element) is formed in the emission area EMA, and a circuit including switching, sensing, and driving transistors for driving the organic light emitting diode OLED is formed in the circuit area DRA. Elements formed in the emission area EMA and the circuit area DRA are formed by a process of depositing a thin film which includes a plurality of metal layers and a plurality of insulation layers.

The first to fourth subpixels SPn1 to SPn4 operate such that an organic light emitting diode OLED disposed in the emission area EMA emits light in response to operation of the switching and driving transistors disposed in the circuit area DRA. "WA" indicates a wiring area positioned between the first subpixel SPn1 and the fourth subpixel SPn4, and a first power line EVDD, a sensing line VREF, and first to fourth data lines DL1 to DL4 are disposed in the line area.

Electrodes of a TFT in addition to wires, such as the first power line EVDD, the sensing line VREF, and the first to fourth data lines DL1 to DL4, are disposed in different layers but electrically connected by contact through a contact hole (a via hole). The contact hole is formed by dry etching or wet etching so that some of the electrodes, signal lines, or power lines disposed in a lower layer are exposed.

As illustrated in FIG. 6, a driving transistor DR and a capacitor Cst are disposed in an upper region of the circuit area DRA. A portion which is connected to a first power line EVDD in a first direction (a vertical direction) and adjacent to a first power connection line EVDDC positioned in a second direction (a horizontal direction) is defined as the upper region of the circuit area DRA.

A switching transistor SW, a sensing transistor ST, and a scan line GL1 are disposed in a lower region of the circuit area DRA. The switching transistor SW and the sensing transistor ST are disposed in the same line with reference to a first scan line GL1 positioned in the second direction. A portion which is connected to the sensing line VREF in the first direction and adjacent to a sensing connection line VREFC positioned in the second direction is defined as the lower region of the circuit area DRA.

As illustrated in FIGS. 6 to 8, the first scan line GL1, the first power line EVDD, the sensing line VREF, the first to fourth data lines DL1 to DL4, the first power connection line EVDDC, and the sensing connection line VREFC of the experimental example are formed as metal layers as below.

The first scan line GL1 is formed as a gate metal layer (see GL1_GAT in FIG. 8). The first power line EVDD, the sensing line VREF, and the first to fourth data lines DL1 to DL4 are formed as source drain metal layers (see DL3_SD and DL4_SD in FIG. 8) disposed above the gate metal layer GL1_GAT. The first power connection line EVDDC and the sensing connection line VREFC are formed as a light shield layer (not shown) disposed below the gate metal layer.

In FIG. 8, BUF indicates a buffer layer covering the light shield layer, GI indicates a first insulation layer (or a gate insulation layer) covering the buffer layer, and ILD indicates a second insulation layer (or an inter-insulation layer) covering the gate metal layer, PAS is a third insulation layer (or a protective layer) covering the second insulation layer, and OC indicates a fourth insulation layer (or a planarization layer) covering the third insulation layer.

As shown in the drawings, the first scan line GL1 corresponding to a horizontal line has a region intersecting with a vertical line which includes the first power line EVDD, the sensing line VREF, and the first to fourth data lines DL1 to DL4. These are respectively formed based on the gate metal layer and the source drain metal layer, and thus, a problem such as a short between heterogeneous metal layers (which is caused by etching deviation in an etching process) is highly likely to occur in the intersecting region despite of a difference in height of layers.

To address this problem, the experimental example uses a gate redundancy structure not just to protect damage of a wire, such as a signal line and a power line, or an electrode caused by a laser beam in a repair process, but also to increase convenience of the repair process.

In the gate redundancy structure of the experimental example, only the first scan line GL1 having a region intersecting with the vertical line is split into two lines. Accordingly, when a short occurs between heterogeneous metal layers in an intersection region of the heterogeneous lines, the experimental example is able to address the occurrence of the short by removing one of two branch lines of the first scan line GL1. For example, if a short occurs between the first scan line GL1 in an upper layer and the third data line DL3 in a lower layer, it is possible to address the short by removing a first cutting area CA1 and a second cutting area CA2 with a laser beam.

However, the gate redundancy method as in the experimental example is not able to address a defect (GDS defect) between a gate electrode and a source/drain electrode of transistors SW and SW connected to the first scan line GL1. In addition, the gate redundancy method as in the experimental example has a limited repair margin RM for a repair process, thereby having a spatial limitation (which makes it impossible to address various defects and causes a repair defect).

First Embodiment

Figure 9:
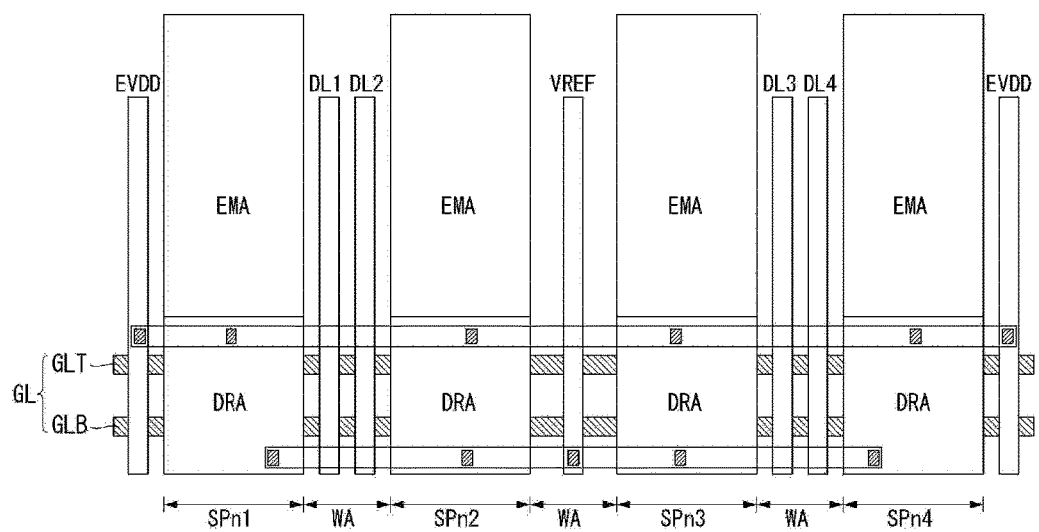
FIG. 9 is a diagram schematically illustrating a plane layout of a subpixel according to a first embodiment.
Figure 10:
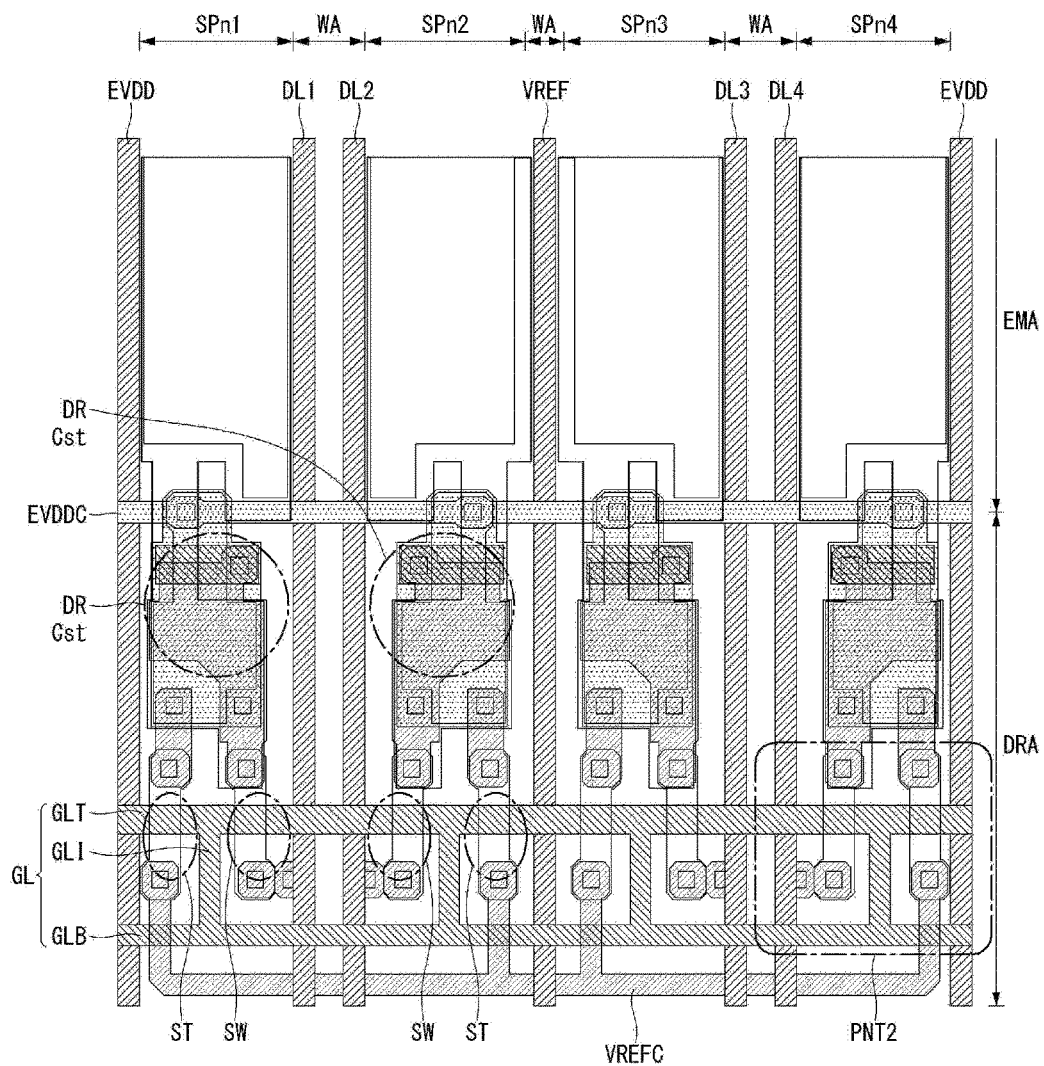
FIG. 10 is a detailed diagram illustrating a plane layout of a subpixel according to the first embodiment.
Figure 11:
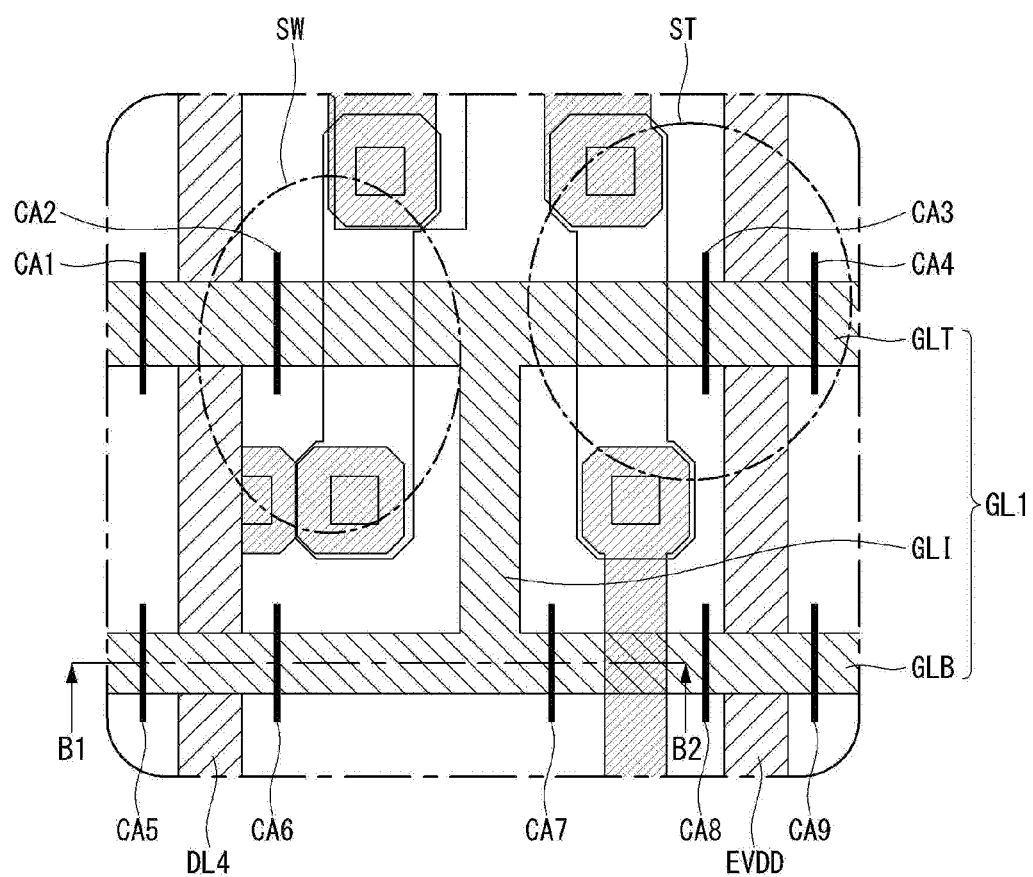
FIGS. 11 and 12 are diagrams illustrating an improvement of the first embodiment.
Figure 12:
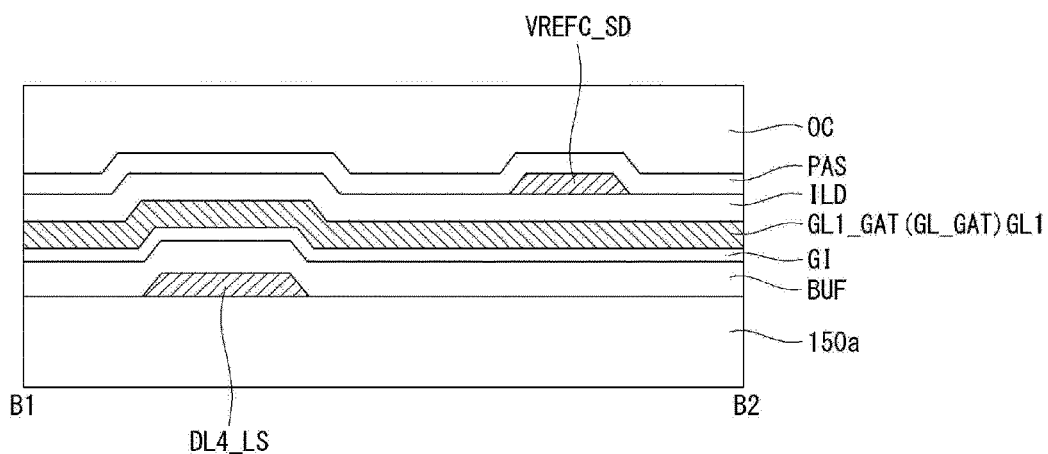
Figure 13:
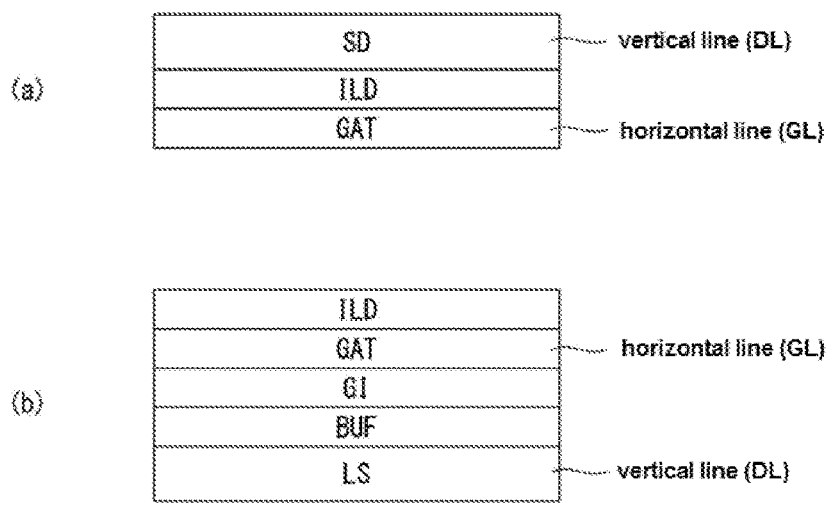
FIG. 13 is a diagram for explanation of a difference between the experimental example and the first embodiment.

FIG. 9 is a schematic diagram illustrating a plane layout of a subpixel according to a first embodiment, FIG. 10 is a detailed diagram illustrating a plane layout of a subpixel according to the first embodiment, FIGS. 11 and 12 are diagrams illustrating an improvement of the first embodiment, and FIG. 13 is a diagram for explanation of a difference between the experimental example and the first embodiment.

As illustrated in FIGS. 4 and 9, first to fourth subpixels SPn1 to SPn4 each having an emission area EMA and a circuit area DRA are formed on a display area AA of a first substrate 150a. An organic light emitting diode OLED (an light emitting element) is formed in the emission area EMA, and a circuit including switching, sensing, and driving transistors for driving the organic light emitting diode OLED is formed in the circuit area DRA. Elements formed in the emission area EMA and the circuit area DRA are formed by a process of depositing a thin film which includes a plurality of metal layers and a plurality of insulation layers.

The first to fourth subpixels SPn1 to SPn4 operate such that an organic light emitting diode OLED disposed in the emission area EMA emits light in response to operation of the switching and driving transistors disposed in the circuit area DRA. "WA" indicates a wiring area positioned between the first subpixel SPn1 and the fourth subpixel SPn4, and a first power line EVDD, a sensing line VREF, and first to fourth data lines DL1 to DL4 are disposed in the line area.

Electrodes of a TFT in addition to wires, such as the first power line EVDD, the sensing line VREF, and the first to fourth data lines DL1 to DL4, are disposed in different layers but electrically connected by contact through a contact hole (a via hole). The contact hole is formed by dry etching or wet etching so that some of the electrodes, signal lines, or power lines disposed in a lower layer are exposed.

As illustrated in FIG. 10, a driving transistor DR and a capacitor Cst are disposed in an upper region of the circuit area DRA. A portion which is connected to a first power line EVDD in a first direction (a vertical direction) and adjacent to a first power connection line EVDDC positioned in a second direction (a horizontal direction) is defined as the upper region of the circuit area DRA.

A switching transistor SW, a sensing transistor ST, and a scan line GL1 are disposed in a lower region of the circuit area DRA. The switching transistor SW and the sensing transistor ST are disposed in the same line with reference to a first scan line GL1 positioned in the second direction. A portion which is connected to the sensing line VREF in the first direction and adjacent to a sensing connection line VREFC positioned in the second direction is defined as the lower region of the circuit area DRA.

As illustrated in FIGS. 10 to 12, the first scan line GL1, the first power line EVDD, the sensing line VREF, the first to fourth data lines DL1 to DL4, the first power connection line EVDDC, and the sensing connection line VREFC of the first embodiment are formed as metal layers as below.

The first scan line GL1 is formed as a gate metal layer (see GL1_GAT in FIG. 12). Over the entire region of the display area, the first scan line GL1 includes two lines GLT and GLB, and a plurality of scan connection lines GLI. The first scan line GL1 includes a first upper scan line GLT, a first lower scan line GLB, and a scan connection line GLI. The first upper scan line GLT is disposed close to a central region of the circuit area DRA, and the first lower scan line GLB is disclosed close to a lower region of the circuit area DRA. The first upper scan line GLT and the first lower scan line GLB are spaced apart from each other. The scan connection line GLI is positioned between the first upper scan line GLT and the first lower scan line GLB, and electrically connects the first upper scan line GLT and the first lower scan line GLB. The first scan line GL1 is in the shape of a ladder positioned in a horizontal direction.

The first power line EVDD, the sensing line VREF, and the first to fourth data lines DL1 to DL4 are formed as a light shield layer (see DL4_LS in FIG. 12) disposed below the gate metal layer GL1_GAT. The first power connection line EVDDC and the sensing connection line VREFC is formed as a source-drain metal layer (see VREFC_SD in FIG. 12) disposed above the gate metal layer. The sensing connection line VREFC is connected to the sensing line VREF and spaced apart from the first power connection line EVDDC to thereby have a portion disposed in a horizontal direction and a portion disposed in a vertical direction.

In FIG. 12, BUF indicates a buffer layer covering the light shield layer, GI indicates a first insulation layer (or a gate insulation layer) covering the buffer layer, and ILD indicates a second insulation layer (or an inter-insulation layer) covering the gate metal layer, PAS is a third insulation layer (or a protective layer) covering the second insulation layer, and OC indicates a fourth insulation layer (or a planarization layer) covering the third insulation layer.

As shown in the drawings, the first scan line GL1 corresponding to a horizontal line has a region intersecting with a vertical line which includes the first power line EVDD, the sensing line VREF, and the first to fourth data lines DL1 to DL4. These are respectively formed based on the gate metal layer and the light shield layer, and thus, a problem such as a short between heterogeneous metal layers (which is caused by etching deviation in an etching process) is highly likely to occur in the intersecting region despite of a difference in height of layers.

To address this problem, the first embodiment utilizes a gate redundancy structure not just to protect damage of a wire, such as a signal line and a power line, or damage of an electrode caused by a laser beam in a repair process, but also to increase convenience of the repair process.

In the redundancy structure of the first embodiment, every first scan line GL1 over the display area includes two lines GLT and GLB, and a scan connection line GLI is formed therebetween to connect the two lines GLT and GLB. Accordingly, when a short occurs between heterogeneous metal layers in an intersection region of the heterogeneous lines, the first embodiment is able to address the occurrence of the short by removing one of two branch lines of the first scan line GL1. For example, when a short occurs between the first upper scan line GLT and the fourth data line DL4 in a lower layer, it is possible to address the short by removing a first cutting area CA1 and a second cutting area CA2 with a laser beam. Even when the first cutting area CA1 and the second cutting area CA2 are cut off, the first scan line GL1 is able to properly perform electrical and structural functions due to the presence of the first lower scan line GLB.

In addition, the gate redundancy method as in the first embodiment is able to address a defect (GDS defect) between a gate electrode and a source/drain electrode of transistors SW connected to the first scan line GL1. For example, if a short occurs between the first upper scan line GLT, acting as a gate electrode of the switching transistor SW and the sensing transistor ST, and the first power line EVDD in a lower layer in FIG. 11, it is possible to address the short by removing a third cutting area CA3 and a fourth cutting area CA4 with a laser beam. Even when the third cutting area CA3 and the fourth cutting area CA4 are cut off, the first scan line GL1 is able to properly perform electrical and structural function due to the presence of the first lower scan line GLB. At this point, even when a seventh cutting area CA7 and an eighth cutting area CA8, rather than the third cut-of area CA3 and the fourth cutting area CA4, or even when a ninth cutting area CA9 is cut off together with the third cut-of area CA3 and the fourth cutting area CA4, the first scan line GL1 is able to properly perform electrical and structural function due to the presence of the first upper scan line GLT.

In addition, the redundancy method as in the first embodiment has so many repair sections that it is not necessary to consider a repair margin for performing a repair process, and thus, it does not has a spatial limitation (which makes it impossible to address various defects and causes a repair defect). This may be understood clearly with reference to the above two examples.

As illustrated in FIG. 13(a), the experimental example is implemented such that scan lines corresponding horizontal lines are formed based on the gate metal layer GAT disposed below the second insulation layer ILD. In addition, a first powerline, a sensing line, and first to fourth data lines, which respectively correspond to vertical lines, are formed based on the source-drain metal layer SD disposed above the second insulation layer ILD.

As illustrated in FIG. 13(b), the first embodiment is implemented such that scan lines corresponding to horizontal lines are formed based on the gate metal layer GAT disposed below the second insulation layer ILD. In addition, a first power line, a sensing line, and first to fourth data lines, which respectively correspond to vertical lines, are formed based on the light shield layer LS disposed below the buffer layer BUF.

As found in comparison between (a) and (b) in FIG. 13, the buffer layer BUF and two or more insulation layers including the first insulation layer GI exists between the light shield layer LS and the gate metal layer GAT. Due to this characteristic, if a horizontal line and a vertical line are formed according to the first embodiment, a vertical distance between heterogeneous lines increases, thereby further reducing a likelihood of occurrence of short, compared to the experimental example, In addition, as the vertical distance between the heterogeneous lines increases in the first embodiment, the likelihood of occurrence of a defect (a short occurring due to different physical properties) caused by a foreign substance (a etching byproduct and the like) in a process may be reduced as well.

Meanwhile, the first embodiment was described by taking an example in which the first scan line GL1 is changed to have a structure having the first upper scan line GLT, the first lower scan line GLB, and the scan connection line GLI and a vertical line is changed into a light shield layer disposed in the lowest layer. However, the present disclosure may be achieved by using the structures of the following embodiments. The present disclosure may be achieved by combining the first embodiment with the following second and third embodiments.

Second Embodiment

Figure 14:
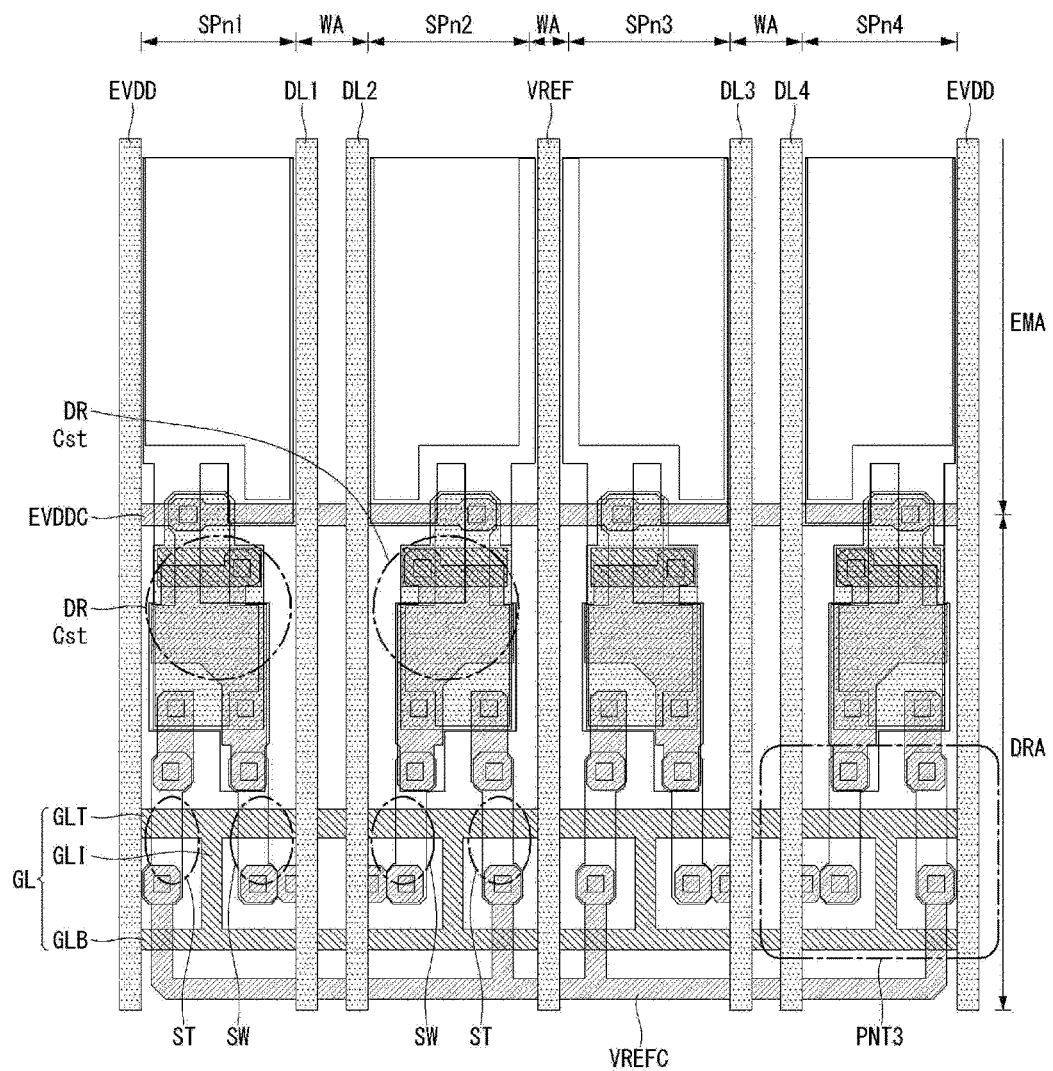
FIG. 14 is a detailed diagram a plan layout of a subpixel according to a second embodiment.
Figure 15:
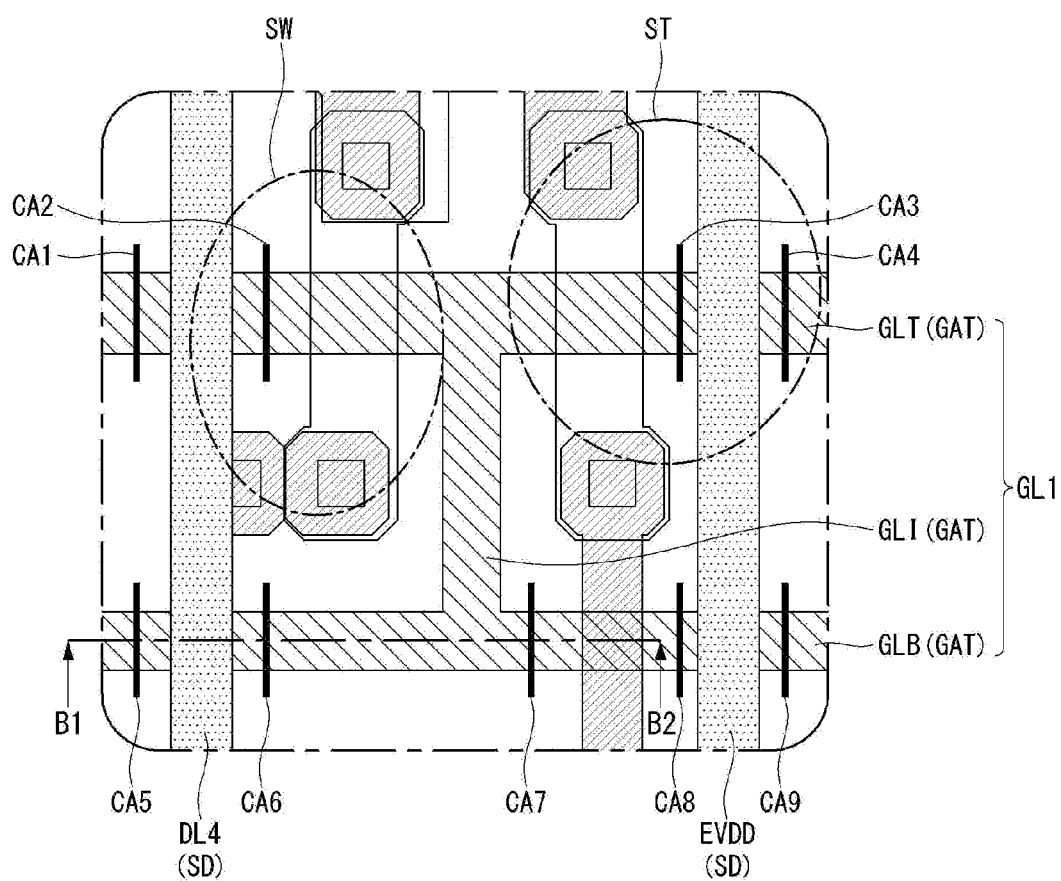
FIG. 15 is a diagram for explanation of an improvement of the second embodiment.

FIG. 14 is a detailed diagram illustrating a plan layout of a subpixel according to a second embodiment, and FIG. 15 is a diagram for explanation of an improvement of the second embodiment.

As illustrated in FIG. 14, a driving transistor DR and a capacitor Cst are disposed in an upper region of the circuit area DRA. A portion which is connected to a first power line EVDD in a first direction (a vertical direction) and adjacent to a first power connection line EVDDC positioned in a second direction (a horizontal direction) is defined as the upper region of the circuit area DRA.

A switching transistor SW, a sensing transistor ST, and a scan line GL1 are disposed in a lower region of the circuit area DRA. The switching transistor SW and the sensing transistor ST are disposed in the same line with reference to a first scan line GL1 positioned in the second direction. A portion which is connected to the sensing line VREF in the first direction and adjacent to a sensing connection line VREFC positioned in the second direction is defined as the lower region of the circuit area DRA.

As illustrated in FIGS. 14 and 15, the first scan line GL1, the first power line EVDD, the sensing line VREF, the first to fourth data lines DL1 to DL4, the first power connection line EVDDC, and the sensing connection line VREFC of the first embodiment are formed as metal layers as below.

The first scan line GL1 is formed as a gate metal layer GAT. Over the entire region of the display area, the first scan line GL1 include two lines GLT and GLB, and a plurality of scan connection lines GLI. The first scan line GL1 includes a first upper scan line GLT, a first lower scan line GLB, and a scan connection line GLI. The first upper scan line GLT is disposed close to a central region of the circuit area DRA, and the first lower scan line GLB is disclosed close to a lower region of the circuit area DRA. The first upper scan line GLT is spaced apart from the first lower scan line GLB. The scan connection line GLI electrically connects the two separate lines.

The first power line EVDD, the sensing line VREF, and the first to fourth data lines DL1 to DL4 are formed as a source-drain metal layer SD disposed above the gate metal layer GAT. The first power connection line EVDDC and the sensing connection line VREFC are formed as a light shield layer disposed below the gate metal layer GAT. The sensing connection line VREFC is connected to the sensing line VREF and spaced apart from the first power connection line EVDDC to thereby have a portion disposed in a horizontal direction and a portion disposed in a vertical direction.

As shown in the drawings, the first scan line GL1 corresponding to a horizontal line has a region intersecting with a vertical line which includes the first power line EVDD, the sensing line VREF, and the first to fourth data lines DL1 to DL4. These are respectively formed based on the gate metal layer and the source-drain metal layer, and thus, a problem such as a short between heterogeneous metal layers (which is caused by etching deviation in an etching process) is highly likely to occur in the intersecting region despite of a difference in height of layers.

To address this problem, the second embodiment uses a gate redundancy structure not just to protect damage of a wire, such as a signal line and a power line, or an electrode caused by a laser beam in a repair process, but also to increase convenience of the repair process.

In the redundancy structure of the second embodiment, every first scan line GL1 over the display area includes two lines GLT and GLB, and a scan connection line is formed therebetween to connect the two lines GLT and GLB. Accordingly, when a short occurs between heterogeneous metal layers in an intersection region of the heterogeneous lines, the second embodiment is able to address the occurrence of the short by removing one of two branch lines of the first scan line GL1. An example thereof is identical to the first embodiment and thus it is not herein described.

In addition, the gate redundancy method as in the second embodiment is able to address a defect (GDS defect) between a gate electrode and a source/drain electrode of transistors SW and SW connected to the first scan line GL1. An example thereof is identical to the first embodiment and thus it is not herein described.

In addition, the redundancy method as in the second embodiment has so many repair sections that it is not necessary to consider a repair margin for performing a repair process, and thus, it does not has a spatial limitation (which makes it impossible to address various defects and causes a repair defect). This may be understood clearly with reference to the two examples described in the first embodiment.

As found in the second embodiment, even when the gate redundancy structure according to the present disclosure is adapted even in the case where horizontal lines are formed according to an exiting method, it is possible to achieve effects similar/identical to effects of the first embodiment.

Third Embodiment

Figure 16:
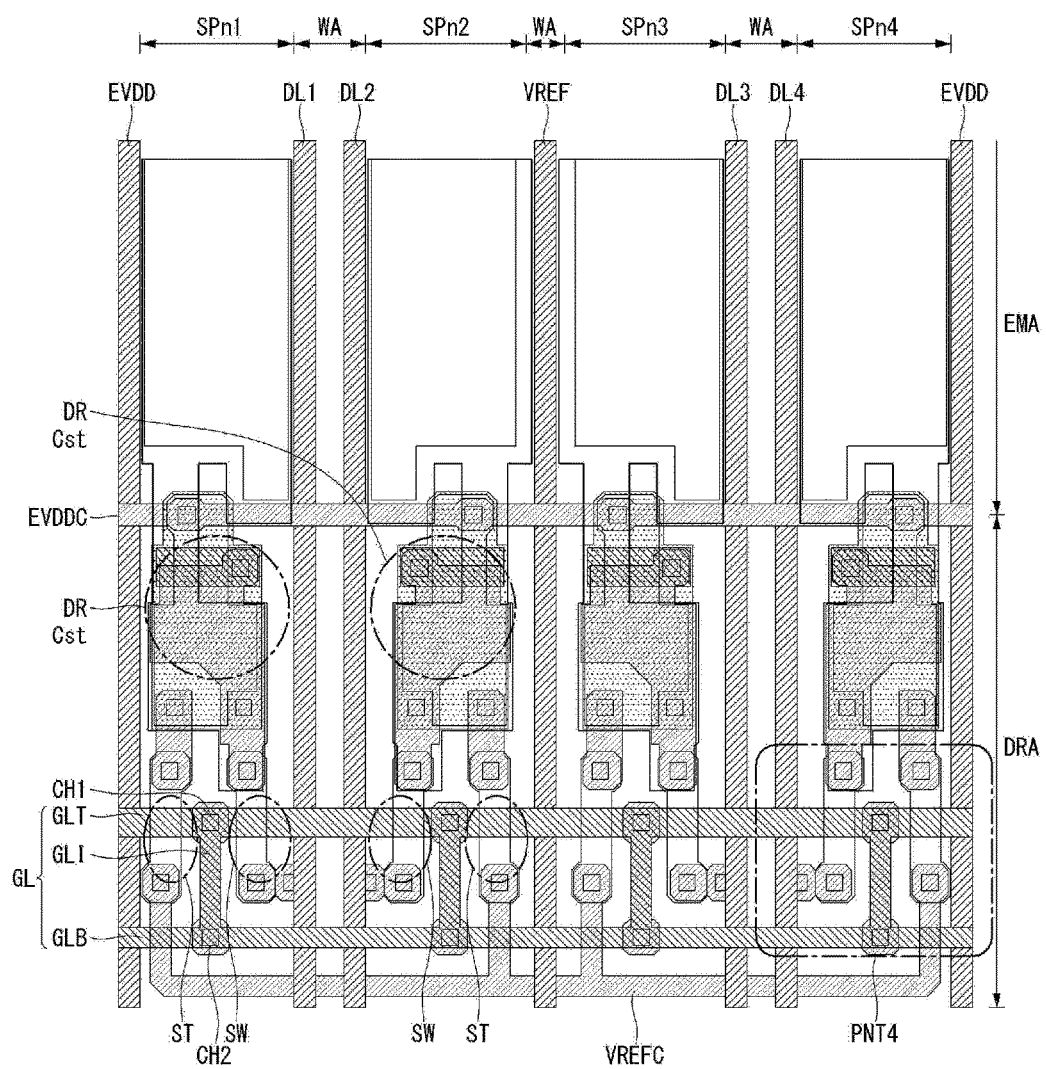
FIG. 16 is a detailed diagram illustrating a plan layout of a subpixel according to a third embodiment.
Figure 17:
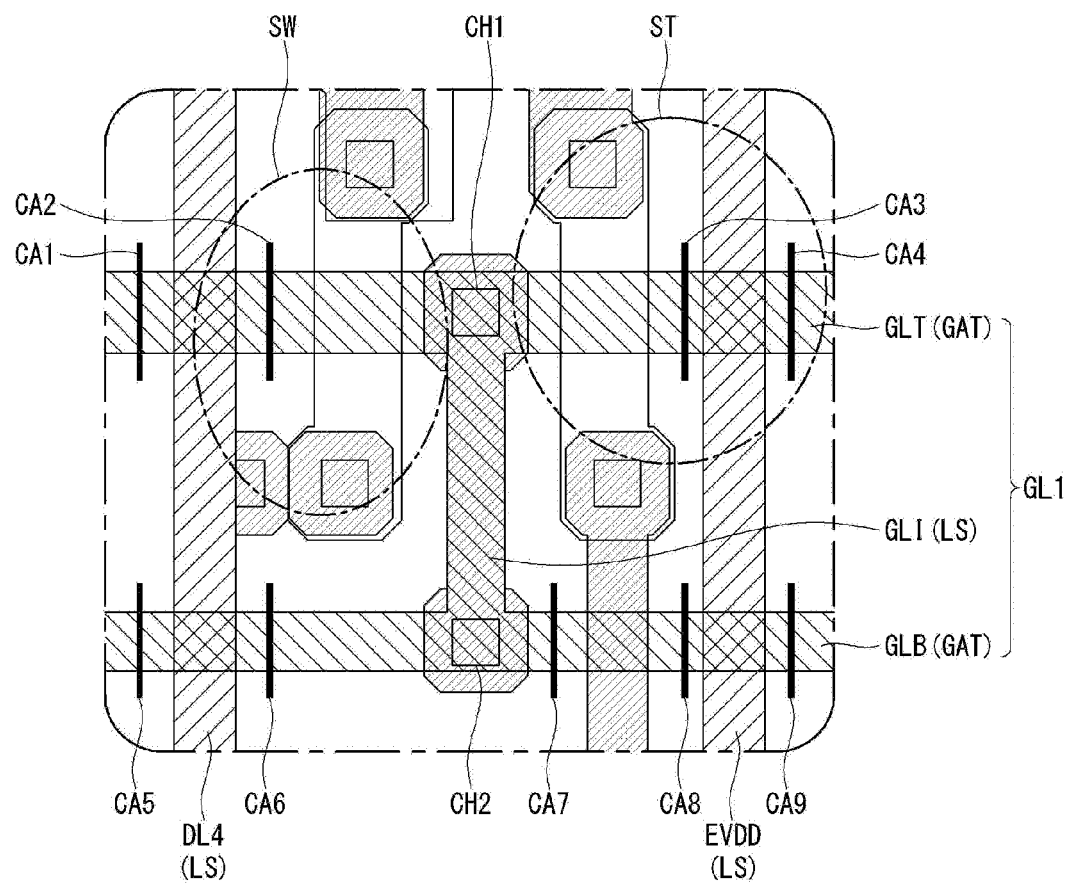
FIG. 17 is a diagram for explanation of an improvement of the third embodiment.

FIG. 16 is a detailed diagram illustrating a plan layout of a subpixel according to a third embodiment, and FIG. 17 is a diagram for explanation of an improvement of the third embodiment.

As illustrated in FIG. 16, a driving transistor DR and a capacitor Cst are disposed in an upper region of the circuit area. A portion which is connected to a first power line EVDD in a first direction (a vertical direction) and adjacent to a first power connection line EVDDC positioned in a second direction (a horizontal direction) is defined as the upper region of the circuit area DRA.

A switching transistor SW, a sensing transistor ST, and a scan line GL1 are disposed in a lower region of the circuit area DRA. The switching transistor SW and the sensing transistor ST are disposed in the same line with reference to a first scan line GL1 positioned in the second direction. A portion which is connected to the sensing line VREF in the first direction and adjacent to a sensing connection line VREFC positioned in the second direction is defined as the lower region of the circuit area DRA.

As illustrated in FIGS. 16 and 17, the first scan line GL1, the first power line EVDD, the sensing line VREF, the first to fourth data lines DL1 to DL4, the first power connection line EVDDC, and the sensing connection line VREFC of the first embodiment are formed as metal layers as below.

The first scan line GL1 is formed as a combination of a gate metal layer GAT and a light shield layer LS. Over the entire region of the display area, the first scan line GL1 include two lines GLT and GLB, and a plurality of scan connection lines GLI. The first scan line GL1 includes a first upper scan line GLT, a first lower scan line GLB, and a scan connection line GLI. The first upper scan line GLT is disposed close to a central region of the circuit area DRA, and the first lower scan line GLB is disclosed close to a lower region of the circuit area DRA.

The first upper scan line GLT and the first lower scan line GLB are formed as the gate metal layer GAT. On the other hand, the scan connection line GLI is formed as the light shield layer LS. The scan connection line GLI includes: a first contact hole CH1 (a first contact region) formed in a region corresponding to the first upper scan line GLT; and a second contact hole CH2 (a second contact region) formed in a region corresponding to the first lower scan line GLB. Through the first contact hole CH1 and the second contact hole CH2 of the scan connection line GLI, the first upper scan line GLT and the first lower scan line GLB are electrically connected. That is, the first upper scan line GLT and the first lower scan line GLB are spaced apart from each other and electrically connected to each other by heterogeneous metal layers.

The first power line EVDD, the sensing line VREF, and the first to fourth data lines DL1 to DL4 are formed as a light shield layer (see DL4_LS in FIG. 12) disposed below the gate metal layer GL1_GAT. The first power connection line EVDDC and the sensing connection line VREFC are formed as a source-drain metal layer (see VREFC in FIG. 12) disposed above the gate metal layer. The sensing connection line VREFC is connected to the sensing line VREF and spaced apart from the first power connection line EVDDC to thereby have a portion disposed in a horizontal direction and a portion disposed in a vertical direction. As shown in the drawings, the first scan line GL1 corresponding to a horizontal line has a region intersecting with a vertical line which includes the first power line EVDD, the sensing line VREF, and the first to fourth data lines DL1 to DL4. These are respectively formed based on the gate metal layer and the source-drain layer, and thus, a problem such as a short between heterogeneous metal layers (which is caused by etching deviation in an etching process) is highly likely to occur in the intersecting region despite of a difference in height of layers.

To address this problem, the third embodiment uses a gate redundancy structure not just to protect damage of a wire, such as a signal line and a power line, or an electrode caused by a laser beam in a repair process, but also to increase convenience of the repair process.

In the redundancy structure of the third embodiment, every first scan line GL1 over the display area includes two lines GLT and GLB, and a scan connection line GLI is formed therebetween to connect the two lines GLT and GLB. Accordingly, when a short occurs between heterogeneous metal layers in an intersection region of the heterogeneous lines, the third embodiment is able to address the occurrence of the short by removing one of two branch lines of the first scan line GL1. An example thereof is identical to the first embodiment and thus it is not herein described.

In addition, the gate redundancy method as in the third embodiment is able to address a defect (GDS defect) between a gate electrode and a source/drain electrode of transistors SW connected to the first scan line GL1. An example thereof is identical to the first embodiment and thus it is not herein described.

In addition, the redundancy method as in the third embodiment has so many repair sections that it is not necessary to consider a repair margin for performing a repair process, and thus, it does not has a spatial limitation (which makes it impossible to address various defects and causes a repair defect). This may be understood clearly with reference to the two examples described in the first embodiment.

As found in the third embodiment, even when horizontal lines are formed according to the first embodiment and a gate redundancy structure is formed by combining a gate metal layer and a light shield layer, it is possible to achieve the similar/identical effects of the first embodiment. Meanwhile, the third embodiment is described by taking an example in which the scan connection line GLI is selected as the light shield layer LS, but the scan connection line GLI may be selected as a gate metal layer.

As such, the present disclosure is described by distinguishing the first to third embodiments, but each of the first to third embodiments may be combined with one or two other embodiments to optimize vertical and horizontal lines.

When manufacturing a display panel having a sensing circuit to sense characteristics of an element, the present disclosure have effects of securing an aperture ratio of a subpixel while preventing damage of a wire or electrode caused by a repair process. In addition, the present disclosure may provide a wiring structure in which the repair process is able to be performed in response to various defects. In addition, the present disclosure may provide a structure of a display panel, which is suitable for manufacturing a display device having high resolution and a large screen.

What is claimed is:

1. A display device comprising:
   subpixels each having an emission area and a circuit area, wherein the emission area is formed on a first substrate and includes a light emitting element disposed therein, and the circuit area includes a circuit for driving the light emitting element; and
   at least one scan line disposed on the circuit area in a horizontal direction,
   wherein the at least one scan line comprises:
   an upper scan line and a lower scan line spaced apart from each other on an insulation layer formed on the first substrate; and
   a scan connection line disposed under or on the insulation layer, and electrically connecting the upper scan line and the lower scan line.

2. The display device of claim 1, wherein the upper scan line and the lower scan line are connected to a gate electrode of a switching transistor disposed in the circuit area and a gate electrode of a sensing transistor disposed in the circuit area.

3. The display device of claim 1, wherein the upper scan line, the lower scan line, and the scan connection line are disposed on a same layer, or at least one thereof is disposed in a different layer.

4. The display device of claim 1,
   wherein the upper scan line and the lower scan line are formed of a same material as a gate metal layer that configures a gate electrode of a transistor disposed in the circuit area, and
   wherein the scan connection line is formed of a same material as a light shield layer disposed below the gate metal layer.

5. The display device of claim 4, wherein the scan connection line comprises:
   a first contact region formed at a location corresponding to the upper scan line; and
   a second contact region formed at a location corresponding to the lower scan line.

6. The display device of claim 1, further comprising: a vertical line which comprises a data line, a sensing line, and a power line disposed in a vertical direction on the first substrate,
   wherein the vertical line is formed of a same material as a light shield layer existing in a lowest layer of the first substrate.

7. The display device of claim 6, further comprising:
   a first power connection line disposed in a horizontal direction on the first substrate, and connected to the first power line; and
   a sensing connection line connected to the sensing line and spaced apart from the first power connection line to thereby have a portion disposed in the horizontal direction and a portion disposed in the vertical direction,
   wherein the sensing connection line and the first power connection line configure a source-drain electrode of a transistor disposed in the circuit area.

8. The display device of claim 7, wherein the at least one scan line is in a shape of a ladder positioned in a horizontal direction between the first sensing connection line and the first power connection line.

9. A display device comprising:
   subpixels; and
   a scan line connected to the subpixels,
   wherein the scan line is in a shape of a ladder positioned in a horizontal direction,
   wherein the scan line comprises:
   an upper scan line and a lower scan line spaced apart from each other on an insulation layer formed on a first substrate; and
   a scan connection line disposed under or on the insulation layer, and electrically connecting the upper scan line and the lower scan line.

10. The display device of claim 9, wherein the upper scan line, the lower scan line, and the scan connection line are disposed on the same layer.

11. The display device of claim 9, wherein at least one of the upper scan line, the lower scan line, and the scan connection line is disposed in a different layer.

12. The display device of claim 9, wherein the scan line comprises:
   wherein the upper scan line and the lower scan line are formed as a gate metal layer that configures a gate electrode of a transistor disposed in a circuit area, and
   wherein the scan connection line is formed as a light shield layer disposed below the gate metal layer.

* * * * *